(12) United States Patent
Johnstone et al.

(10) Patent No.: US 6,356,225 B1
(45) Date of Patent: Mar. 12, 2002

(54) AVERAGING CELL MISMATCHES IN INTEGRATED CIRCUITS

(75) Inventors: Kevin K. Johnstone, Mountain View; Yusuf A. Haque, Woodside; Mark Albert Pinchback, San Mateo, all of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/465,327

(22) Filed: Dec. 14, 1999

(51) Int. Cl.$^7$ .............................................. H03M 1/12
(52) U.S. Cl. ........................................ 341/155; 327/408
(58) Field of Search .............................. 341/162, 155; 327/408, 563, 427; 330/51, 307, 252

(56) References Cited

U.S. PATENT DOCUMENTS

| | | | |
|---|---|---|---|
| 4,379,285 A | * 4/1983 | Dooley | 341/162 |
| 4,641,108 A | * 2/1987 | Gill, Jr. | 357/45 |
| 5,175,550 A | 12/1992 | Kattmann et al. | 341/159 |
| 5,444,414 A | * 8/1995 | Delano | 327/563 |
| 5,835,048 A | 11/1998 | Bult | 341/159 |
| 5,880,631 A | * 3/1999 | Sahota | 330/51 |
| 6,040,732 A | * 3/2000 | Brokaw | 327/408 |

\* cited by examiner

*Primary Examiner*—Peguy JeanPierre
(74) *Attorney, Agent, or Firm*—Fish & Richardson P.C.

(57) ABSTRACT

An integrated circuit may include matched cells each having an active transconductor, wherein the matched cells are coupled together through respective active transconductor circuits to average the effect of comparator input-referred offsets. Each cell of the matched cells may have a first differential gain stage coupled to a second differential gain stage that is coupled to an output buffer stage, and an associated active transconductor circuit. The active transconductor of each cell is coupled to the gain stage of other cells to average the effect of cell mismatches.

9 Claims, 5 Drawing Sheets

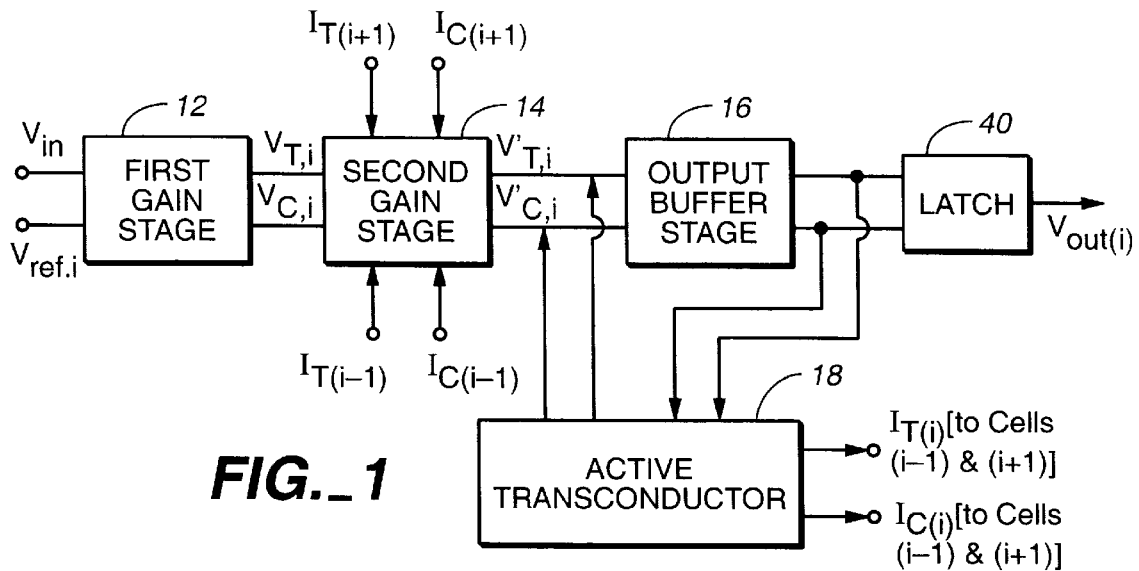
FIG._1
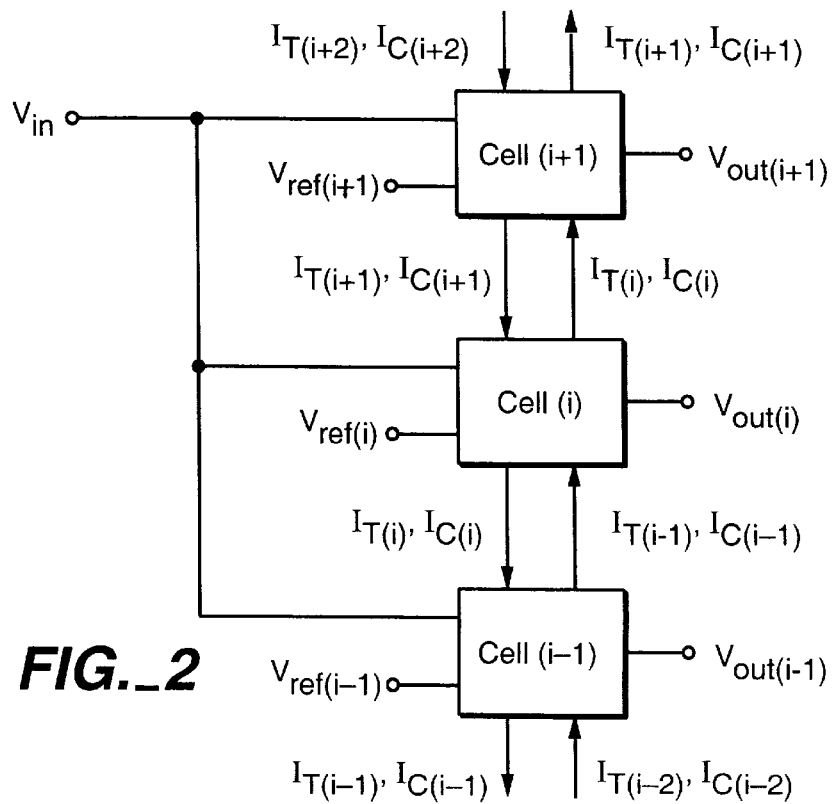
FIG._2

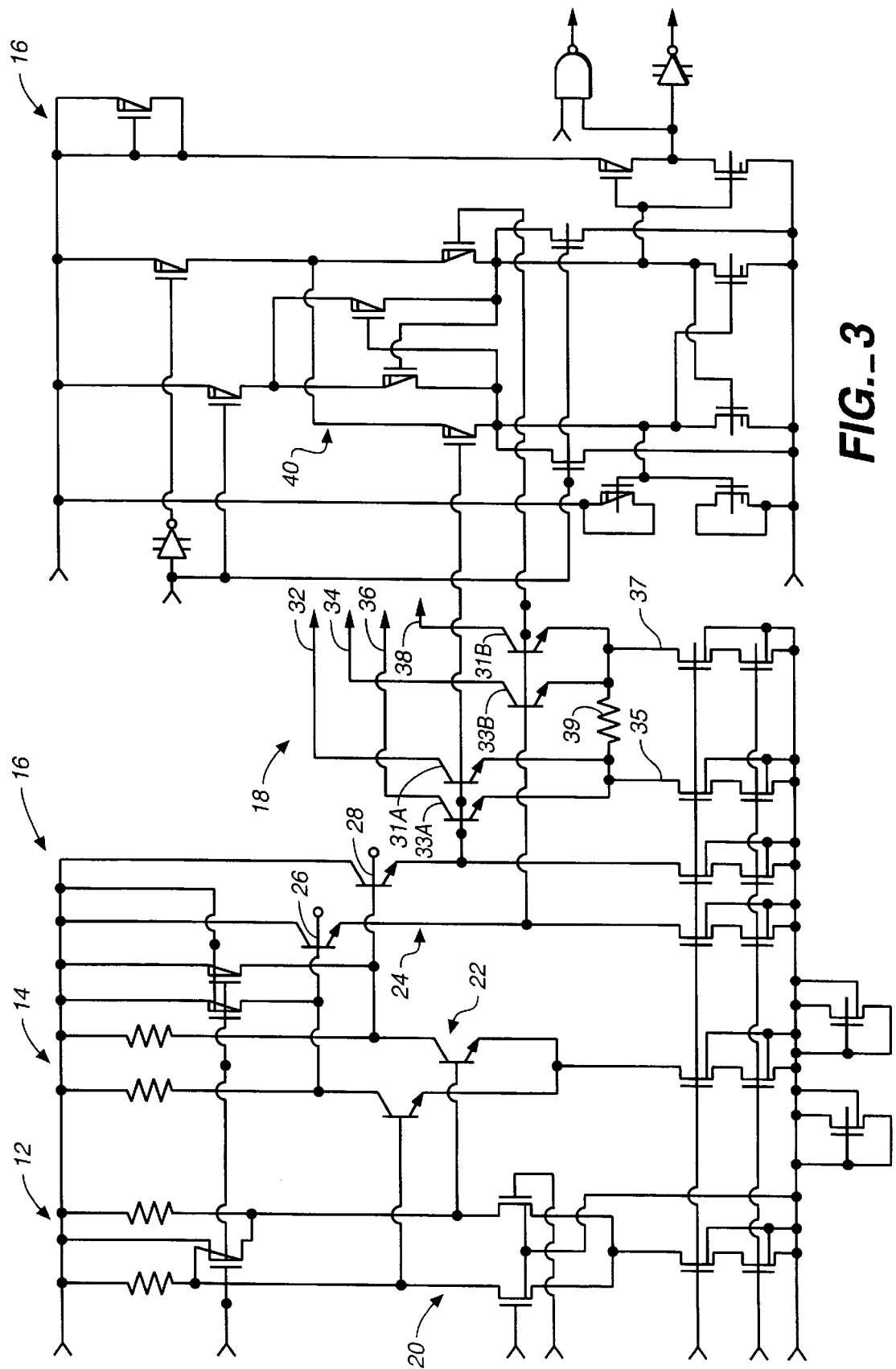
FIG._3

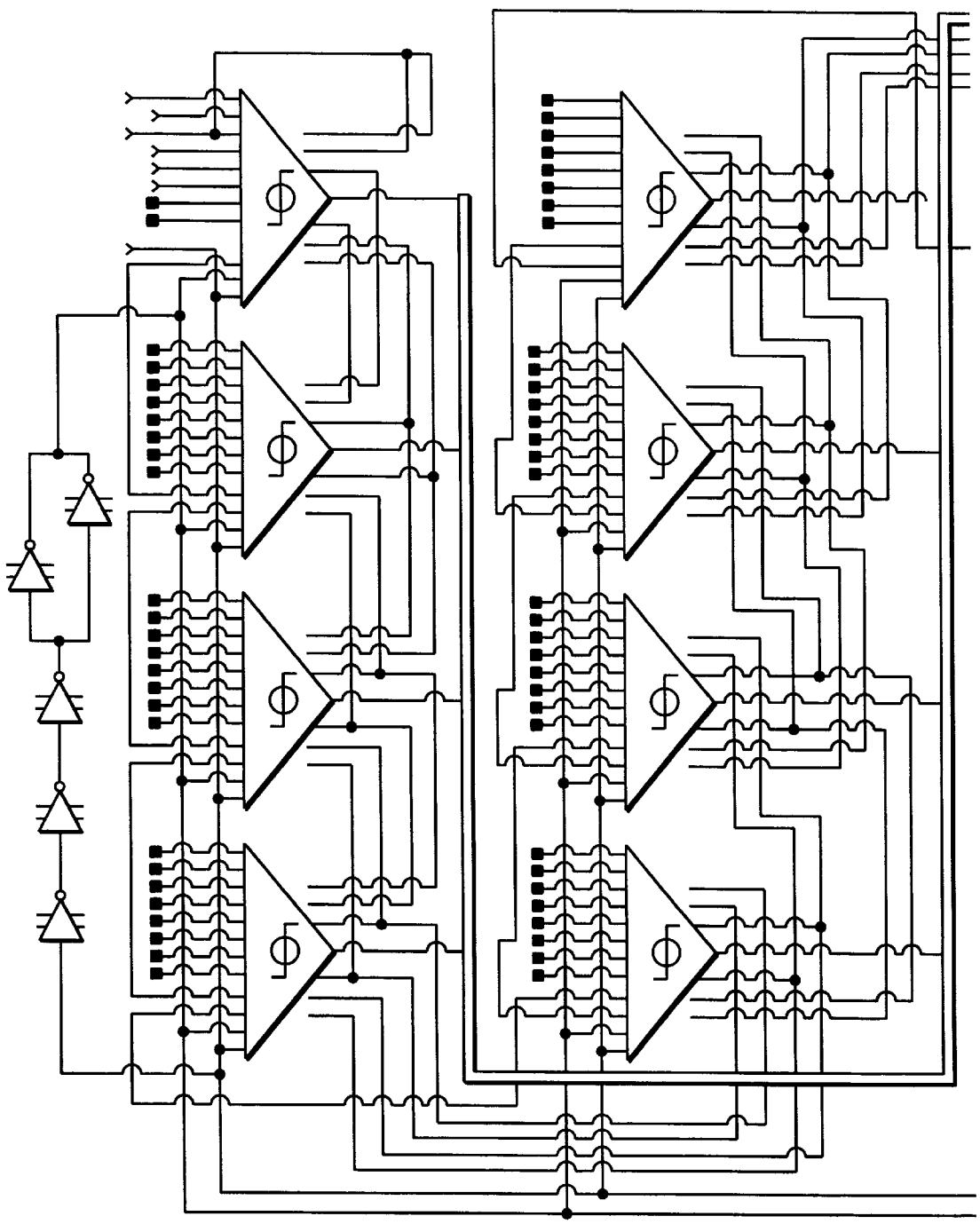
*FIG._4A*
*FIG._4A* | *FIG._4B* | *FIG._4C*
*FIG._4*

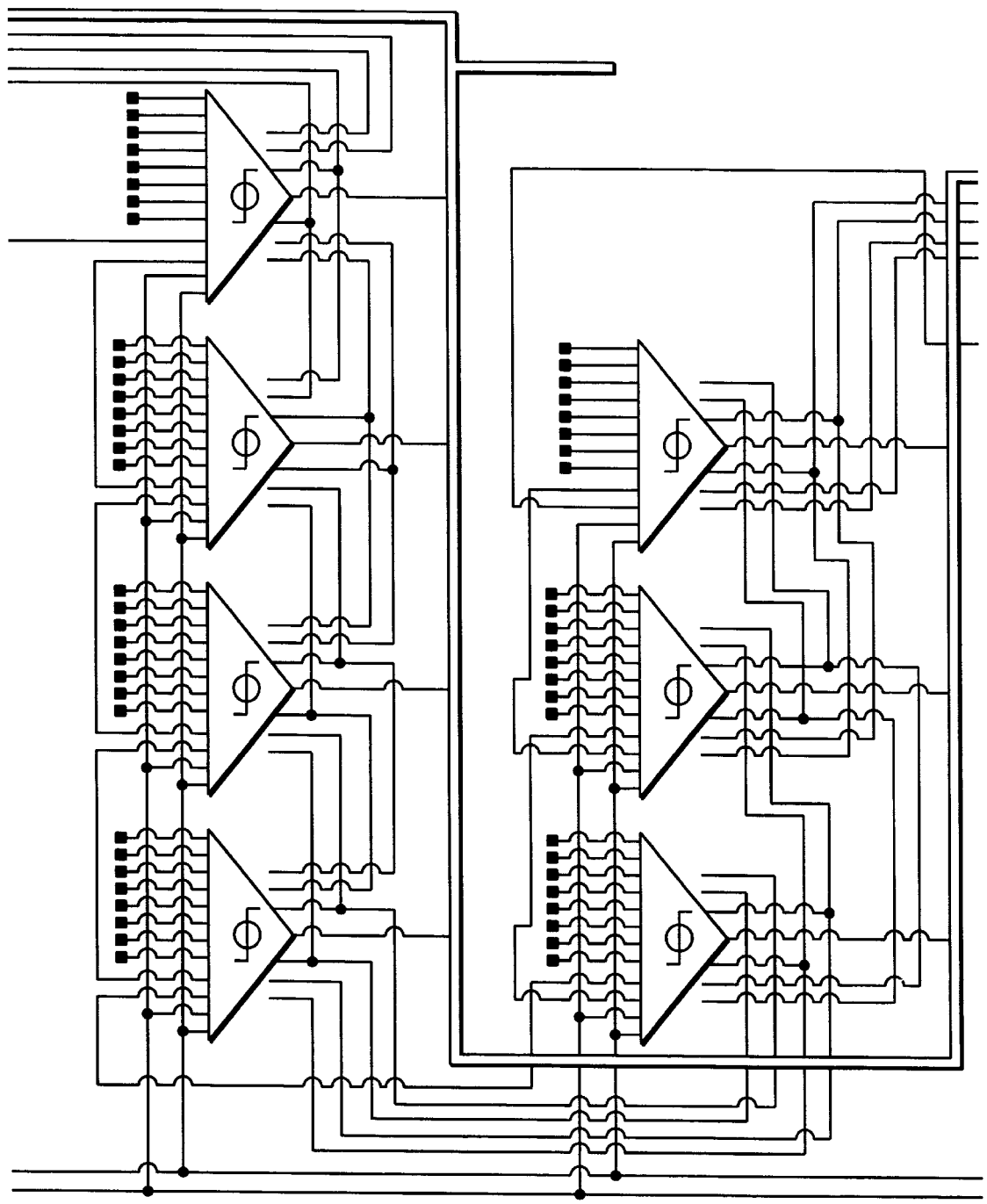
FIG._4B

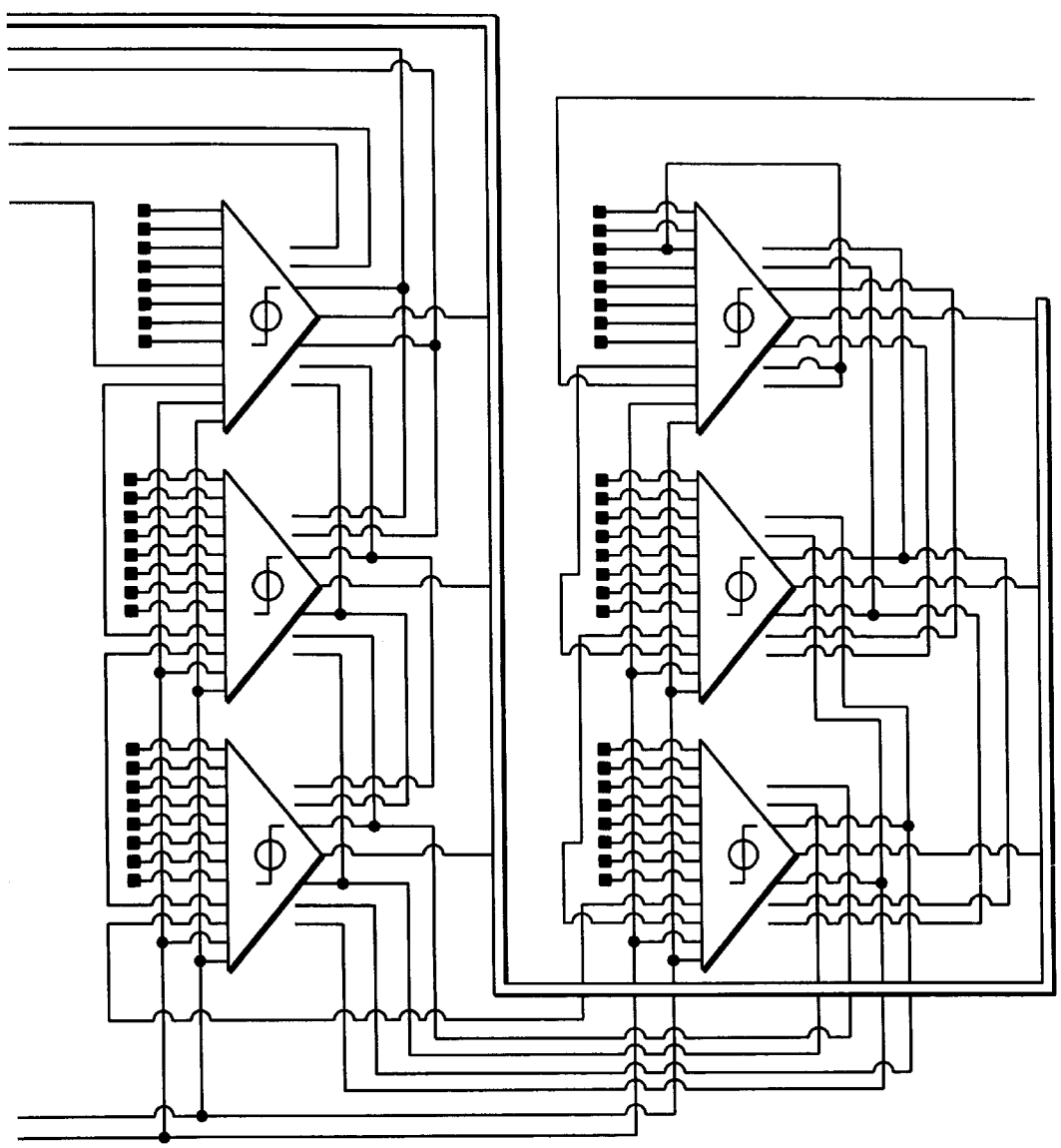
FIG._4C

AVERAGING CELL MISMATCHES IN INTEGRATED CIRCUITS

BACKGROUND OF THE INVENTION

This invention relates to systems and methods of averaging cell mismatches in integrated circuits, such as "flash" analog-to-digital converters (ADCs).

Many integrated circuits, such as analog-to-digital converters and digital-to-analog converters, are formed from a plurality of matched cells—that is, each cell has the same design and, ideally, should have the same operating characteristics. It is well known, however, that slight mismatches in the components of the cells are unavoidable in practical systems, and that such mismatches have an undesirable impact on the operating performance. For example, cell mismatches occurring in a flash ADC may adversely affect the differential nonlinearity and the integral nonlinearity. Differential nonlinearity is a measure of nonuniform step size between adjacent code transitions; integral nonlinearity is a measure of the deviation of the code center line from an ideal straight line drawn through the end points of the transfer characteristic.

Techniques for reducing the impact of cell mismatches in flash ADCs have been proposed. For example, Kattmann (U.S. Pat. No. 5,175,550) has proposed a flash ADC that includes a network of equal-valued resistors each of which is coupled between corresponding points of a pair of adjacent differential input cells of the ADC. Bult (U.S. Pat. No. 5,835,048) has proposed a flash ADC that includes the same resistor network.

SUMMARY OF THE INVENTION

In one aspect, the invention features an integrated circuit, comprising a pair of matched cells. Each cell has an active transconductor circuit associated with the cell, wherein the matched cells are coupled together through respective active transconductors. The active transconductors generate currents which are used to average the effect of cell mismatches.

Embodiments may include one or more of the following features.

Each cell may include first and second differential gain stages, an output buffer stage and a latch, with an active transconductor circuit coupled to the output of the second gain stage. The active transconductor circuit associated with each cell may include a differential pair of transistors controlled by the output of the output buffer stage of the associated cell and connected to the output of the second gain stage of the adjacent cells.

As used herein, the term "active transconductor" refers to one or more active circuit components (e.g., transistors) configured to convert a received input voltage into an output current.

In another aspect, the invention features an integrated circuit comprising several matched cells, each having a differential input stage, a gain stage and output buffer stage and a latch, and a transconductor circuit associated therewith, wherein the transconductor circuit of each cell is responsive to the output of the output buffer stage and is coupled to the gain stage of other cells to average the effect of cell mismatches.

Embodiments may include one or more of the following features.

A plurality of additional matched cells each having a differential input stage, a gain stage, an output buffer stage and a latch, and a transconductor circuit associated with each additional cell. The cells may be grouped with each having the associated transconductor circuit responsive to the output of the output buffer stage of that cell and coupled to the output of the second gain stage of the adjacent cells to provide currents to adjacent cells, thereby averaging the effect of cell mismatches. The transconductor circuit of each cell is an active transconductor circuit and may include a pair of differential pairs of bipolar transistors.

Among the advantages of the invention are the following.

The invention substantially reduces the impact of cell matching problems by generating currents to average cell mismatches. Since the transconductor circuit includes active devices, the impedance seen by the output of the preceding output buffer stage is high enough to not appreciably cause a gain attenuation of the gain stage of the cell. Also, by applying the generated currents to the output of the gain stage, rather than to the input stage, the impact of variations in the transconductors is reduced.

Other features and advantages will become apparent from the following description, including the drawings and the claims.

BRIEF DESCRIPTION OF THE DRAWINGS

FIG. 1 is a block diagram of an integrated circuit cell that includes an active transconductor.

FIG. 2 is a block diagram of a plurality of cells with pairs of adjacent cells coupled together to distribute offset averaging currents.

FIG. 3 is a circuit diagram of an integrated circuit cell that includes an active transconductor.

FIG. 4 is a circuit diagram of a plurality of cells with pairs of adjacent cells coupled together to distribute offset averaging currents.

DETAILED DESCRIPTION

The following embodiments are described in connection with a flash ADC integrated circuit. The invention, however, may be used in other kinds of integrated circuits containing matched cells.

Referring to FIGS. 1 and 2, a cell (i) of a flash ADC integrated circuit includes a first differential gain stage 12, a second gain stage 14, an output buffer stage 16 and a latch 40. The active transconductor circuit 18 is also associated with each cell. Differential input stage 12 is coupled to receive a voltage ($V_{in}$) and a reference voltage ($V_{ref,i}$) and is configured to produce amplified voltages $V_{T,i}$ and $V_{C,i}$; the gain of differential input stage 12 may be about two to three. Gain stage 14 amplifies voltages $V_{T,i}$ and $V_{C,i}$ with a gain of about five to produce voltages $V'_{T,i}$ and $V'_{C,i}$. As explained in detail below, gain stage 14 also is coupled to receive currents $I_{T(i+1)}$, $I_{C(i+1)}$ and $I_{T(i-1)}$, $I_{C(i-1)}$ from adjacent cells (i+1) and (i−1), respectively. The distribution of the currents among the coupled cells averages the adverse effects of component mismatches on the transfer characteristics of the ADC. Output buffer stage 16 receives amplified voltages $V'_{T,I}$ and $V'_{C,I}$ and provides a low impedance output to latch 40. Latch 40 is configured to produce an output voltage $V_{out(i)}$ that corresponds to a binary "1" or binary "0" depending upon the relative values of the input voltages $V_{in}$ and $V_{ref,i}$. In particular, $V_{out(i)}$ corresponds to a binary "1" when $V_{in}$ exceeds $V_{ref,i}$, and $V_{out(i)}$ corresponds to a binary "0" when $V_{in}$ is less than $V_{ref,i}$.

Active transconductor circuit 18 also receives the output of output buffer stage 16 and is configured to produce currents $I_{T(i)}$ and $I_{C(i)}$ which are distributed to adjacent cells (i−1) and (i+1). The currents $I_{T(i)}$ and $I_{C(i)}$ have a high source impedance and include a current component responsive to the output of the output buffer stage 16.

As shown in FIG. 2, cells (i−1) and (i+1) are coupled to receive respective reference input voltages $V_{ref(i−1)}$ and $V_{ref(i+1)}$. The reference input voltages for each of the cells (i−1), (i) and (i+1) each correspond to a different progressive fraction of a voltage reference and may be provided by a resistor ladder network coupled between the voltage reference and a ground reference. The binary outputs of cells (i−1), (i) and (i+1) are coupled to known logic circuitry which is configured to produce an ADC voltage transfer characteristic from the cell outputs $V_{out(i−1)}$, $V_{out(i)}$ and $V_{out(i+1)}$.

The cells (i−1), (i) and (i+1) are designed to be matched—that is, the cells are designed to have the same transfer characteristics. Practical integrated circuit fabrication techniques, however, are unable to perfectly match the cell components (e.g., resistors and transistors) and, consequently, slight differences in the transfer characteristics of each of the cells will exist. These differences may result in an undesirable level of differential nonlinearity and integral nonlinearity in the ADC transfer characteristic. The invention substantially reduces the impact of cell matching problems by generating currents to average the effect of cell mismatch among adjacent cells through active transconductor circuits 18. This effectively averages the cell offset errors across the entire transfer function of the ADC. The resulting cell offset errors are substantially reduced.

Referring to FIG. 3, in one embodiment, an ADC cell (i) may be implemented using BICMOS circuit fabrication techniques. Input stage 12 includes a CMOS differential input stage which has a gain of about two to three. The voltages produced at the output of differential input stage 20 are applied to the inputs of differential gain stage 14, the output of which is buffered by an emitter-follower output buffer stage 16. The currents $I_{T(i−1)}$, $I_{C(i−1)}$ and $I_{T(i+1)}$, $I_{C(i+1)}$ for averaging the effect of cell mismatches which are received from cells (i−1) and (i+1) are applied to nodes 26 and 28 of gain stage 14, as shown.

Active transconductor circuit 18 is coupled to the output buffer stage 16 and is implemented as a degenerated, dual differential bipolar transistor pair 31 and 33 (with pair 31 consisting of transistors 31A and 31B, and pair 33 consisting of transistors 33A and 33B) the dual differential transistor pair 31 and 33 being driven in unison by the output of the output buffer stage 16. When the output of the output buffer stage is zero, each transistor in the dual differential transistor pair 31 and 33 generates or conducts the same amount of current, namely one fourth of the two current sources 35 and 37 supplying current to the two ends of the degeneration resistor 39. When the output of the output buffer stage is not zero, one transistor in each dual differential transistor pair 33 generates or conducts an increased current, and the other transistor in each dual differential transistor pair 31 and 33 generates or conducts a corresponding decreased current, each in proportion to the output of the output buffer stage. In either case, the active transconductors steer the current of the current sources. The currents $I_{T(i)}$ and $I_{C(i)}$ are distributed from cell (i) to cells (i−1) and (i+1) through nodes 32, 34, 36 and 38 of active transconductor 18. Because active transconductor circuit 18 includes active devices, the impedance seen by the output buffer stage 16 is relatively high. Since the output impedance of the output buffer stage 16 is low, the gain attenuation of gain stage 14 is minimal.

In operation, mismatches in differential input stage 12 and in gain stage 14 produce a voltage difference between nodes 26 and 28. This voltage is converted into a proportional current component by active transconductor circuit 18 and coupled to the output of the gain stage of adjacent cells. (Note that even if the differential output of the output buffer stage of a cell is zero, equal currents will be generated at all four nodes 32, 34, 36 and 38 of the cell and be coupled to adjacent cells.) The coupling of the generated currents from one cell to an adjacent cell is such as to cause the output of the gain stage and thus the output of the output buffer stage of the adjacent cell to shift in the direction of the output of the output buffer stage of the cell generating the currents, thereby tending to decrease differences between cells.

Latch 40 is implemented with CMOS transistors and is coupled to receive a latch command (LAT). Subsequent to a latch command, the input stage of the cell is disabled and the logic state at the output of the cell is stored until an "enable" or "unlatched" command is received.

FIG. 4 shows an integrated circuit for a flash ADC that includes twenty-one cells, with adjacent cells coupled together through respective active transconductors to distribute the effects of cell mismatch among the coupled cells. In this way, the input referred voltage offsets of individual cells are averaged. As explained above, this feature improves the linearity of the DC transfer function associated with the group of cells.

Other embodiments are with the scope of the claims. Although the above embodiments have been described as having a limited number of cells, other embodiments may contain a greater number of cells. Also, the cells of other embodiments may include a greater number of connections between the cells. For example, in addition to distributing currents due to cell mismatch between the nearest neighboring cells, each cell may also exchange currents due to cell mismatch with next-to-nearest neighboring cells (not necessarily of the same magnitude); in some embodiments, each cell may exchange cell mismatch currents with each of the other cells of the integrated circuit.

What is claimed is:

1. An integrated circuit comprising a plurality of matched cells each having active transconductors associated therewith, wherein the matched cells are coupled together through respective active transconductors to average the effect of cell mismatches.

2. The integrated circuit of claim 1 wherein each cell comprises a gain stage, an output buffer stage and a latch, each cell having active transconductors associated therewith and responsive to the output of the respective output buffer stage to provide currents to the output of the gain stages of adjacent cells to average the effect of cell mismatches.

3. The integrated circuit of claim 1 wherein each cell comprises first and second gain stages, an output buffer stage and a latch, each cell having active transconductors associated therewith and responsive to the output of the respective output buffer stage to provide currents to the output of the second gain stages of adjacent cells to average the effect of cell mismatches.

4. The integrated circuit of claim 3 wherein the first and second stages and the output buffer stage are differential stages.

5. The integrated circuit of claim 1 wherein the active transconductors of each cell comprise at least one differential pair of transistors.

6. The integrated circuit of claim 5 wherein the transistors are bipolar transistors.

7. A method of averaging the effect of cell mismatches in a plurality of matched cells comprising:

generating currents responsive to the output of each cell; and, coupling the generated currents to adjacent cells to encourage the output of the adjacent cells toward the output of the cell generating the respective currents.

8. The method of claim 7 wherein the currents are generated responsive to the output of each cell by steering the currents of current sources responsive to the output of each cell.

9. The method of claim 8 wherein each cell has an output buffer stage, wherein the currents responsive to the output of each cell are responsive to the output of the output buffer stage of the respective cell, and the generated currents are coupled to the input of the output buffer stages of adjacent cells to encourage the output of the adjacent cells toward the output of the cell generating the respective currents.

* * * * *